United States Patent [19]
Burnham et al.

[11] 4,045,749
[45] Aug. 30, 1977

[54] CORRUGATION COUPLED TWIN GUIDE LASER

[75] Inventors: Robert D. Burnham; Donald R. Scifres, both of Los Altos; William Streifer, Palo Alto, all of Calif.

[73] Assignee: Xerox Corporation, Stamford, Conn.

[21] Appl. No.: 634,682

[22] Filed: Nov. 24, 1975

[51] Int. Cl.² ............................................... H01S 3/19
[52] U.S. Cl. ................................. 331/94.5 H; 357/18
[58] Field of Search .................... 331/94.5; 357/16, 17, 357/18

[56] References Cited
PUBLICATIONS
Aiki et al., GaAs-GaAlAs Distributed-Feedback Diode Lasers with Separate Optical and Carrier Confinement, App. Phys. lett., vol. 27, No. 3 (Aug. 1, 1975), pp. 145-146.
Nakamura et al., CW Operation of Distributed-Feedback GaAs-GaAlAs Diode Lasers at Temperatures up to 300 K. App. Phys. Lett., vol. 27, No. 7 (Oct. 1, 1975), pp. 403-405.

Primary Examiner—William L. Sikes
Attorney, Agent, or Firm—M. J. Colitz; T. J. Anderson; L. Zalman

[57] ABSTRACT

An electrically pumped distributed feedback grating coupled diode laser having an optical cavity containing two closely spaced layers, a first of the layers is electrically pumped and the second of the layers is corrugated. Optical wavelength radiation and amplification of said radiation is generated in the first layer by carrier recombination with the radiation spreading to the second layer for coherent reflection by the corrugation and for low loss transmission. Carrier confinement in the first layer and optical confinement in the optical cavity are achieved by surrounding each of these layers by materials having a higher bandgap and lower index of refraction than the materials of the first and the second layers. The corrugation of the second layer can extend over only a portion of the length of the second layer such that the uncorrugated portion of the second layer provides a low loss waveguide.

13 Claims, 4 Drawing Figures

4,045,749

CORRUGATION COUPLED TWIN GUIDE LASER

BACKGROUND OF THE INVENTION

Electrically pumped distributed feedback diode lasers are known in which optical feedback is provided by a corrugated interface between the active layer and an adjacent waveguide layer of the laser. The corrugation is generally produced by an ion milling or chemical etching process which often produces defects in the active layer adjacent to the corrugation. These defects enhance the magnitude of non-radiative recombination of carriers in the active region, resulting in reduced efficiency increased threshold current density.

OBJECTS OF THE INVENTION

It is an object of the present invention to provide an improved laser.

It is a further object of the present invention to provide a distributed feedback laser with reduced non-radiative recombination of carriers.

It is a further object to provide a distributed feedback laser with grating coupled output.

It is a still further object of the present invention to provide a laser with an integral low loss light transmission waveguide.

In accordance with the invention, the optical cavity of an electrically pumped distributed feedback diode laser is comprised of first and second closely spaced, parallel waveguide layers of low bandgap and high refractive index material which are separated by a thin layer of a higher bandgap and lower refractive index materials. The first of the twin waveguide layers is the active layer into which carriers are injected under forward biased conditions to generate coherent radiation and amplification upon carrier recombination. The coherent radiation is distributed to the second waveguide layer where radiation feedback is provided by a periodic corrugation between the second of the twin waveguide layers and the layer of higher bandgap material. Thus, the feedback-producing periodic corrugation is not directly adjacent to the active layer and non-radiative carrier recombination caused by corrugation-produced defects is reduced.

The light output of the twin waveguide optical cavity can be coupled out of the laser by an integral optical waveguide circuit which includes an extension of the second waveguide layer. The feedback-producing corrugation does not extend into the extension portion of the second waveguide layer and the extension portion of the second waveguide layer is made wider than the portion of the second waveguide layer containing the corrugations. The increased width of the extension portion of the second waveguide layer causes a greater amount of the radiation intensity to propagate in the second waveguide layer along the extended portion and thus the integrated opotical waveguide has low attenuation.

DETAILED DESCRIPTION OF THE INVENTION

Figure 1:
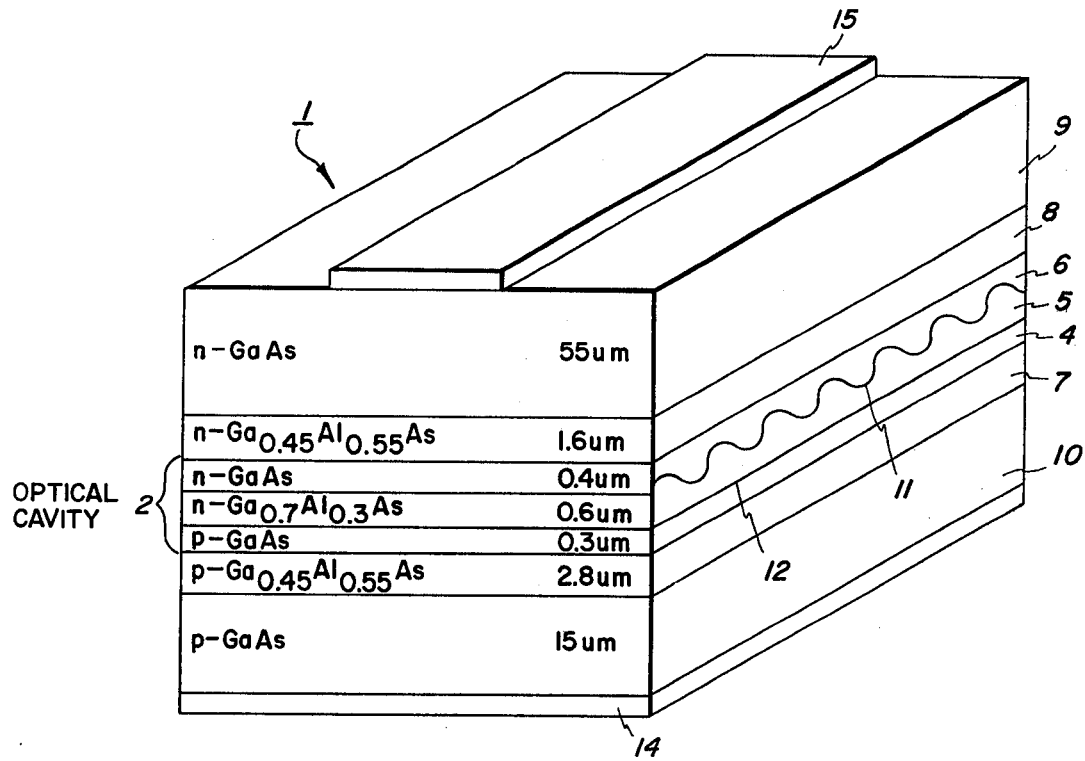
FIG. 1 is a schematic diagram of a twin waveguide laser in accordance with the present invention.

Referring now to FIG. 1, there is shown a schematic diagram of a laser 1 comprised of a plurality of contiguous layers of semiconductor materials and having a twin waveguide optical cavity 2 comprised of a light producing waveguide layer 4 and corrugated waveguide layer 6. Waveguide layers 4 and 6 are each bounded on one side by a layer 5, with waveguide layer 4 bounded on the other side by layer 7 and waveguide layer 6 bounded on the other side by layer 8. The laser 1 also includes substrate 9 and contact-facilitating layer 10. A periodic corrugation 11, that is, a periodic structure, is provided at the interface between layers 5 and 6. As indicated in FIG. 1, layers 4, 7 and 10 can have, for example, the thickness shown and can be p-type and layers 5, 6, 8 and 9 can have the thickness shown and can be n-type such that a rectifying junction 12 is provided at the interface of layers 4 and 5. Under forward bias conditions, carriers (electrons and holes) are injected into light producing waveguide layer 4 to provide, upon carrier recombination, the generation of radiation.

The semiconductor materials of layers 4, 5 and 6 of the optical cavity 2 and the semiconductor materials of layers 7 and 8 immediately adjacent optical cavity 2 are selected to meet specified criteria. First, the material of active waveguide layer 4 is selected to have a bandgap lower than the bandgap of the material or materials of layers 5 and 7 such that carriers injected into layer 4 under forward biased conditions are confined to layer 4. Second, the material or materials of layers 5 and 8 are selected to have a bandgap higher than the bandgap of the material of layer 6 to provide optical confinement, that is, waveguiding, of the coherent radiation produced by carrier recombination in layer 4 that spreads into layer 6 via layer 5. Thirdly, the materials of layers 4, 5, 6, 7 and 8 are chosen to minimize lattice mismatch. Specifically, as shown in FIG. 1, layer 4 can be p-type GaAs, layer 5 can be n-type $Ga_{0.7}Al_{0.3}As$, layer 6 can be n-type GaAs, layer 7 can be p-type $Ga_{0.45}Al_{0.55}As$ and layer 8 can be n-type $Ga_{0.45}Al_{0.55}As$. Since aluminum content is directly proportional to material bandgap and since n-type dopents increase bandgap slightly, in the structure specifically shown in FIG. 1 (excluding substrate 9 and layer 10) layer 4 would have the lowest bandgap, layer 6 would have the next lowest bandgap, layer 5 would have the next lowest bandgap, and layers 7 and 8 would have the highest bandgap. The inverse relationships apply to refractive index, that is, layer 4 would have the highest refractive index, layer 6 would have the next highest refractive index, layer 5 would have the next highest refractive index and layers 7 and 8 would have the lowest refractive index. Layer 10 is p-type and substrate 9 is n-type GaAs.

Figure 2:
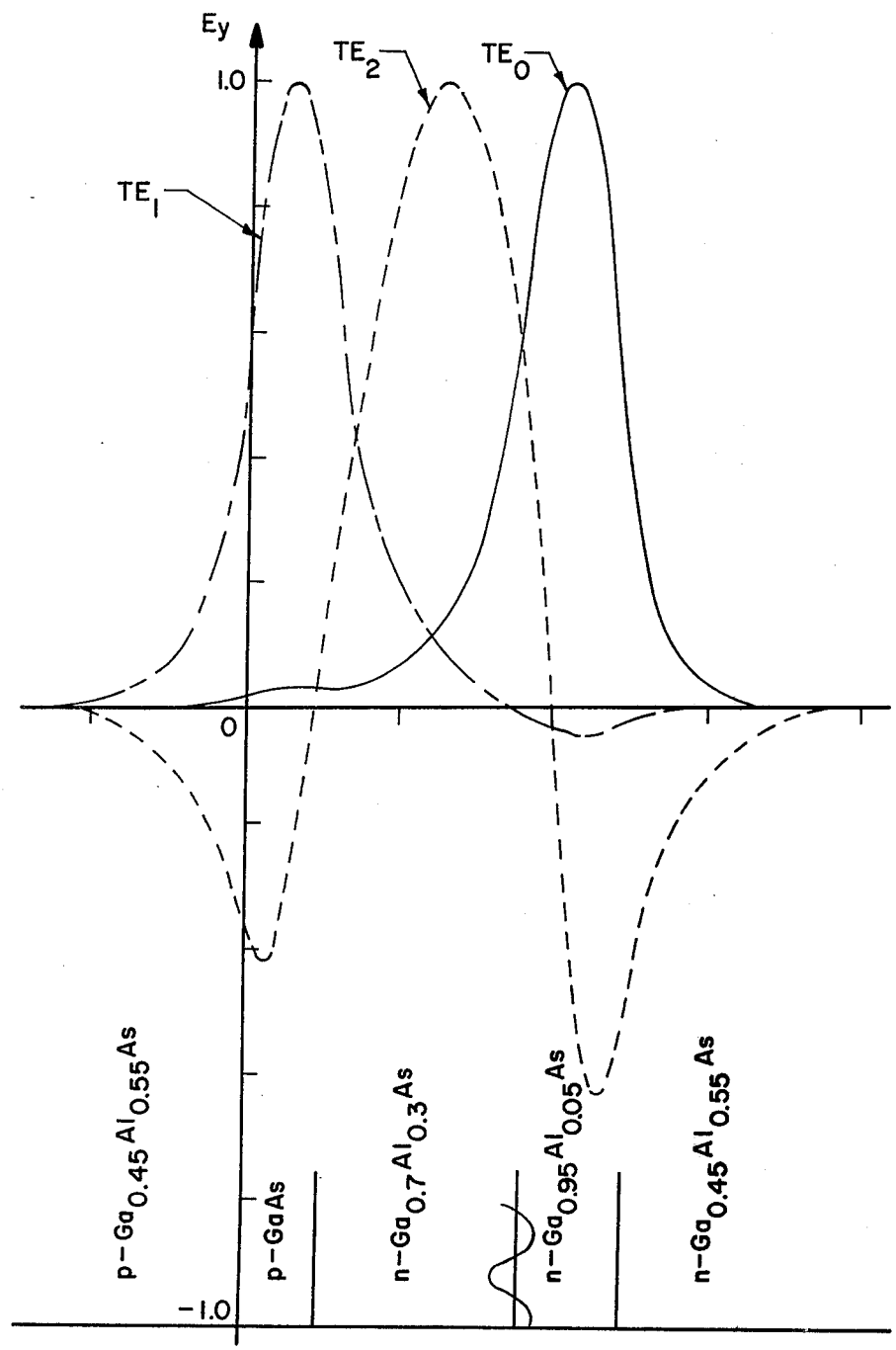
FIG. 2 shows the TE mode patterns of the twin waveguide laser of FIG. 1.

In order to estimate the magnitude of the coupling between the radiation produced in layer 4 and the low loss parallel guiding waveguide layer 6, and the interaction of the coupled radiation with the periodic corrugation 11, it is necessary to determine the mode patterns of the laser 1. FIG. 2 is a plot of the $E_y$ component of the optical field for TE modes in the structure of FIG. 1 for the layer thickness of FIG. 1 and the materials shown. As shown in FIG. 2, the $TE_0$ mode is primarily confined to the unpumped n-type GaAs layer 6 and will therefore experience little gain. The $TE_1$ and $TE_2$ modes, however, do have sufficient coupling with the radiation producing waveguide layer 4, with these two modes also extending into the guiding waveguide layer 6 and interacting with the corrugation 11 such that these two modes are coherently reflected. Light may be coupled out of the laser via layer 6 upon termination of the grating.

The corrugation coupled laser of FIG. 1 is fabricated by first successively growing layers 8 and 6 on n-type GaAs substrate 9 using conventional liquid phase epitaxial growth techniques. The growth of layer 6 is preferably performed at a low temperature (approximately 680° C) in order to achieve better control over the thickness of layer 6. After growth of layers 6 and 8, periodic corrugation 11 is formed by spin coating a photoresist, such as AZ 1350, onto the exposed surface of layer 6 and exposing it interferometrically with an Ar+ laser. The developed standing wave pattern is transferred into the n-type GaAs layer 6 by ion milling through the photoresist mask. The period of the corrugation 11 can be 5370A which provides fourth order distributed feedback and a second order grating coupled output beam. Other mode order outputs can be generated by changing the period of corrugation 11 according to the formula $\Omega = m\lambda/2n_e$ where $\Omega$ is the corrugation period, $m$ is the Bragg mode order, $\lambda$ is the wavelength of the radiation produced by layer 4, and $n_e$ is the equivalent index of refraction of each laser mode. Light may be coupled out of the laser perpendicular or approximately perpendicular to the planes of waveguide layers 4 and 6 depending on corrugation spacing. After the periodic corrugation 11 is milled into the n-type GaAs layer to a depth of 1200A, for example, a second liquid phase epitaxial growth is performed and layers 5, 4, 7 and 10 are grown. Low temperatures (approximately 680° C) are utilized also in the second growth step to avoid meltback of the periodic corrugation 11 and to afford better layer thickness control. After this final growth step, the substrate is polished to the desired thickness and diodes and cleaved from the wafer. Contacts 14 and 15 are then provided to layers 10 and 9, respectively. Molecular beam epitaxy can also be used to form layers 4–8 and 10 and the conductivity types shown in FIG. 1 can be reversed. Also, the corrugation 11 can be formed on the substrate side of layer 6.

Satisfactory results can be produced with materials other than those specifically shown in FIG. 1 provided that the material of layer 4 has the lowest bandgap, the material of layer 6 has the next lowest bandgap, the material of layer 5 has the next lowest bandgap, and the material or materials of layers 7 and 8 have the highest bandgap. For example, layer 6 can have a low aluminum content, for example $Ga_{1-x}Al_xAs$ $0 < x < 0.1$ which would still meet the criteria that layer 6 have the second lowest bandgap. Similarly, the aluminum content of layers 5, 7 and 8 can be changed provided that the bandgap ordering criteria previously noted is maintained.

Figure 3:
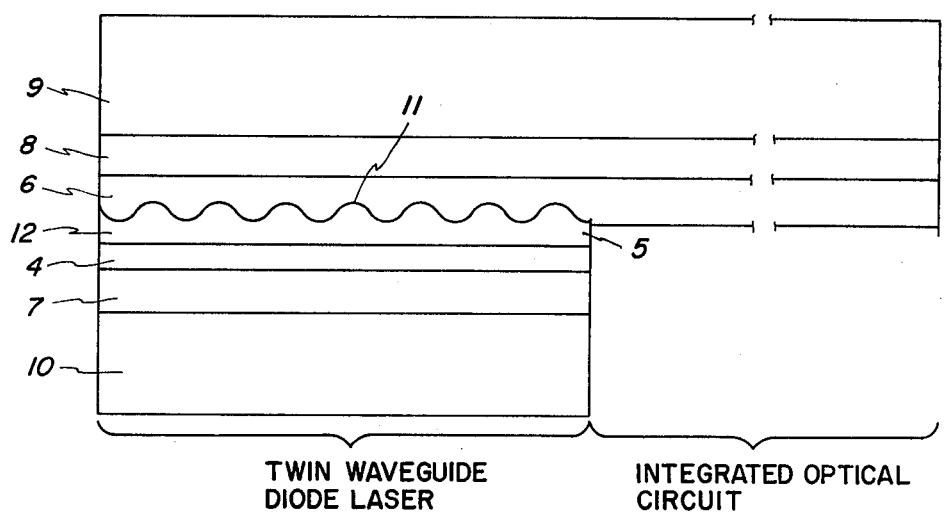
FIG. 3 is a schematic diagram of a twin waveguide laser with an integrated optical circuit waveguide.

An essential step in the aim of achieving practical integrated optical circuits is the coupling of the laser output into a low loss waveguide. Attention is directed to FIG. 3 which is a schematic diagram of a multi-layered semiconductor wafer with a twin waveguide diode laser such as previously described and with an integrated optical circuit provided for coupling radiation to other devices or other sections of the wafer. As shown in FIG. 3, the layers 6, 8 and 9 extend beyond the layers 4, 5, 7 and 10 and the periodic corrugation 11 is terminated at the cutoff location of layers 4, 5, 7 and 10. Since the periodic corrugation 11 does not extend into the integrated optical circuit portion of the wafer, the portion of layer 6 in the integrated optical circuit portion of the wafer is not milled and thus the width of layer 6 in the integrated optical circuit portion of the wafer is greater than the average width of layer 6 in the twin waveguide diode laser portion of the wafer. The process for producing the twin waveguide laser with integrated optical circuit is the same as that for producing the twin waveguide laser of FIG. 1 with the exception that the periodic corrugation 11 is milled into only a portion of layer 6 and an additional etching step is required to remove parts of layers 4, 5, 7 and 10.

As previously described in relation to FIG. 1 and 2, light is generated in layer 4 and is coupled into layer 6. This coupling into layer 6 allows the laser beam to be efficiently transferred into the wider portion of layer 6 for subsequent transmission and utilization.

Figure 4:
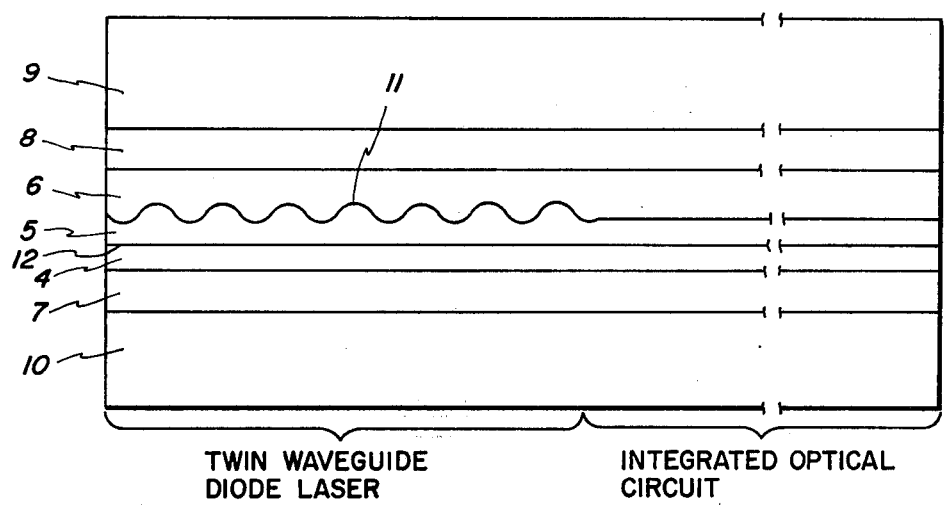
FIG. 4 is a schematic diagram of another embodiment of a twin waveguide laser with an integrated optical circuit waveguide.

An alternative embodiment for coupling laser light into a low loss waveguide is shown in FIG. 4 where the portions of layers 4, 5, 7 and 10 beyond the periodic corrugation 11 are not removed. Since, as in the embodiment of FIG. 3, the thickness of the non-corrugated portion of layer 6 is significantly greater than the average thickness of the corrugated portion of layer 6, a thicker waveguide is provided by the un-corrugated portion of layer 6. Since the thicker waveguide will couple thereto a greater percentage of radiation produced in layer 4 than a thinner waveguide will have coupled thereto, the thicker portion of layer 6 will contain most of the radiation and therefore will provide a low loss waveguide without removal of a portion of the light generating layer 4.

What is claimed is:
1. An electrically pumped, distributed feedback, twin waveguide diode laser comprising:
 a semiconductor body comprised of a plurality of contiguous layers of semiconductor material, one of said layers being the laser active region layer,
 said active region layer being bounded on one side by a first layer and being bounded on another side by a second layer,
 a third layer, said third layer being bound on one side by said second layer and being bounded on another side by a fourth layer,
 said active region layer being of one conductivity type and one of the layers bounding said active region layer being of the other conductivity type such that a rectifying junction is provided between said active region layer and said one of the layers bounding said active region layer, carriers injected under forward bias across said rectifying junction undergoing radiative recombination in said active region layer to generate stimulated coherent radiation,
 the material of said active region layer having a lower bandgap than the materials of both said first layer and said second layer such that confinement is provided for the carriers injected into said active region layer under forward bias,
 the material of said third layer having a lower bandgap than the materials of both said second layer and said fourth layer such that the portion of said coherent radiation that spreads to said third layer is confined to said third layer, one of said boundaries formed with said third layer being a non-planar boundary, said non-planar boundary providing a periodic perturbation of refractive index therealong which interacts with a portion of said radiation that spreads to said third layer to cause said portion of said radiation to be reflected by said periodic perturbation, said perturbation having a period such that said reflected radiation is in phase.

2. The laser of claim 1 wherein said non-planar boundary is between said second and third layers.

3. The laser of claim 1 wherein said active region layer and said third layer are GaAs, and said first, second and fourth layers are GaAlAs.

4. The laser of claim 3 wherein said second layer contains less aluminum than either said first layer or said fourth layer.

5. An electrically pumped, distributed feedback, twin waveguide diode laser comprising:
a semiconductor body comprised of a plurality of contiguous layers of semiconductor material, one of said layers being an active region layer wherein carrier re-combination occurs and another of said layers being a light guiding layer,
said active region layer being bounded by layers of material that have a higher bandgap than the material of said active region layer, said light guiding layer being bounded by layers of material that have a higher bandgap than the material of said light guiding layer,
said active region layer being of one conductivity type and one of the layers bounding said active region layer being of the other conductivity type such that a rectifying junction is provided between said active region layer and said one of the layers bounding said active region layer, carriers injected under forward bias across said rectifying junction undergoing radiative recombination in said active region layer to generate stimulated coherent radiation,
said active region layer and said light guiding layer being disposed within said body such that a portion of said coherent radiation spreads to said light guiding layer,
at least a portion of one of said boundaries formed with said light guiding layer being a non-planar boundary, said non-planar boundary providing a periodic perturbation of the refractive index therealong and interacting with some of said portion of said coherent radiation to cause said some radiation to be reflected by said periodic perturbation, said perturbation having a period such that said reflected radiation is in phase.

6. The laser of claim 5 wherein said active region layer and said light guiding layer are separated by a single layer.

7. The laser of claim 6 wherein said single layer is about 0.6 microns thick.

8. The laser of claim 5 wherein said active region layer and said light guiding layer are GaAs and the layers bounding said active region layer and said light guiding layer are GaAlAs.

9. The laser of claim 6 wherein said single layer has a lower bandgap than the other layers bounding said active region layer and said light guiding layer.

10. The laser of claim 5 wherein said light guiding layer has a portion extending beyond said active region layer and beyond said periodic perturbation such that said light guiding layer has increased thickness beyond said periodic perturbation whereby the extension portion of said light guiding layer acts as an integrated optical circuit.

11. The laser of claim 5 wherein said non-planar boundary extends over only a portion of said one of said boundaries formed with said light guiding layer whereby the portion of said light guiding layer beyond said periodic perturbation acts as an integrated optical circuit.

12. An electrically pumped, distributed feedback, twin waveguide diode laser comprising:
a semiconductor body comprised of a plurality of contiguous layers of semiconductor material, one of said layers being the laser active region layer,
said active region layer being bounded on one side by a first layer and being bounded on another side by a second layer,
a third layer, said third layer being bound on one side by said second layer and being bonded on another side by a fourth layer,
said active region layer being of one conductivity type and one of the layers bounding said active region layer being of the other conductivity type such that a rectifying junction is provided between said active region layer and said one of the layers bounding said active region layer, carriers injected under forward bias across said rectifying junction undergoing radiative recombination in said active region layer to generate stimulated coherent radiation,
the material of said active region layer having a lower bandgap than the materials of both said first layer and said second layer, the material of said third layer having a lower bandgap than the materials of both said second layer and said fourth layer such that coherent radiation that spreads to said third layer is confined to said third layer, said materials of different bandgap providing a plurality of heterojunctions within said semiconductor body,
one of said heterojunctions being a non-planar heterojunction, said non-planar heterojunction providing a periodic perturbation of refractive index therealong which interacts with a portion of said radiation to cause said portion of said radiation to be reflected by said periodic perturbation, said perturbation having a period such that said reflected radiation is in phase.

13. An electrically pumped, distributed feedback, twin waveguide diode laser comprising:
a semiconductor body comprised of a plurality of contiguous layers of semiconductor material, one of said layers being an active region layer wherein carrier recombination occurs and another of said layers being a light guiding layer;
said active region layer being bounded by layers of material that have a lower refractive index than the refractive index of the material of said active region layer, said light guiding layer being bounded by layers of material that have a lower refractive index than the refractive index of the material of said light guiding layer, said materials of different refractive index providing a plurality of heterojunctions within said semiconductor body,
said active region layer being of one conductivity type and one of the layers bounding said active region layer being of the opposite conductivity type such that a rectifying junction is provided between said active region layer and said one of the layers bounding said active region layer, carriers injected under forward bias across said rectifying junction undergoing radiative recombination in said active region layer to generate stimulated coherent radiation, said active region layer and said light guiding layer being disposed within said body such that coherent radiation spreads to said light guiding layer, at least a portion of one of said heterojunctions being a non-planar heterjunction, said non-planar heterojunction providing a periodic perturbation of the refractive index therealong and interacting with coherent radiation to cause coherent radiation to be reflected by said periodic perturbation, said perturbation having a period such that said reflected coherent radiation is in phase.

* * * * *